United States Patent
Bai et al.

(10) Patent No.: US 8,854,813 B2
(45) Date of Patent: Oct. 7, 2014

(54) ADJUSTABLE AIR SUCTION DEVICE

(75) Inventors: Shun-De Bai, Taipei Hsien 221 (TW); Chen-Yi Liang, Taipei Hsien 221 (TW)

(73) Assignee: Wistron Corporation, Taipei Hsien (TW)

( * ) Notice: Subject to any disclaimer, the term of this patent is extended or adjusted under 35 U.S.C. 154(b) by 214 days.

(21) Appl. No.: 13/616,093

(22) Filed: Sep. 14, 2012

(65) Prior Publication Data

US 2013/0342995 A1 Dec. 26, 2013

(30) Foreign Application Priority Data

Jun. 20, 2012 (TW) .............................. 101122002 A

(51) Int. Cl.
*H05K 7/20* (2006.01)
*G06F 1/20* (2006.01)

(52) U.S. Cl.
CPC ... *G06F 1/20* (2013.01); *H05K 7/20* (2013.01)
USPC ................. 361/692; 361/679.47; 361/679.48; 361/679.55; 361/695; 454/184; 165/80.2; 165/80.3; 165/104.33

(58) Field of Classification Search
CPC .............. H05K 7/209; H05K 7/20181; H05K 7/20972; G06F 1/20; G06F 1/203; G06F 1/206; H01L 23/467
USPC ............... 361/679.46–679.55, 690–697, 688, 361/689, 698, 699, 704–727; 165/80.2, 165/80.3, 80.4, 80.5, 104.33, 121–126, 165/185; 454/184, 256; 248/188.2, 188.8, 248/176.3, 125.8, 455

See application file for complete search history.

(56) References Cited

U.S. PATENT DOCUMENTS

| | | | |
|---|---|---|---|
| 6,496,369 B2 * | 12/2002 | Nakamura .................... | 361/697 |
| 7,674,165 B2 * | 3/2010 | Lu et al. ........................ | 454/184 |
| 7,852,628 B2 * | 12/2010 | Hirohata et al. .............. | 361/695 |
| 7,950,611 B2 * | 5/2011 | Tracy et al. ................ | 248/176.3 |
| 8,218,313 B2 * | 7/2012 | Cheng et al. ............. | 361/679.48 |
| 8,464,961 B2 * | 6/2013 | Wu et al. ...................... | 236/49.3 |
| 8,520,382 B2 * | 8/2013 | Tye et al. ...................... | 361/694 |
| 8,625,274 B2 * | 1/2014 | Lin .......................... | 361/679.51 |
| 2005/0168942 A1 * | 8/2005 | Steinbrecher ................ | 361/690 |
| 2006/0146493 A1 * | 7/2006 | Wang et al. .................. | 361/687 |
| 2008/0218969 A1 * | 9/2008 | Muraki ........................ | 361/695 |
| 2010/0048120 A1 * | 2/2010 | Chuang et al. ................ | 454/184 |
| 2011/0043995 A1 * | 2/2011 | Chen et al. .............. | 361/679.55 |

* cited by examiner

*Primary Examiner* — Michail V Datskovskiy
(74) *Attorney, Agent, or Firm* — Rosenberg, Klein & Lee

(57) ABSTRACT

The present disclosure relates to an adjustable air suction device, comprising a driving structure, an air suction structure, and a link structure. The driving structure and the air suction structure are disposed on a housing of an electronic device. The link structure is disposed inside the housing. Both ends of the link structure correspond to the driving structure and the air suction structure, respectively. The driving structure drives one end of the link structure to move towards a first direction, and drives the other end of the link structure to move towards a second direction. The other end of the link structure pushes the air suction structure, and projects from the housing. Besides, the air suction structure corresponds to a heat dissipating device of the electronic device and draws a great deal of fluids into the electronic device for dissipating the heat of the electronic components in the electronic device.

21 Claims, 10 Drawing Sheets

ADJUSTABLE AIR SUCTION DEVICE

FIELD OF THE DISCLOSURE

The present disclosure relates generally to an air suction device, and particularly to an adjustable air suction device used in electronic devices.

BACKGROUND OF THE DISCLOSURE

Owing to the requirements in consumer market in recent years, modern electronic devices are designed in light and small structures. Thereby, the internal space in electronic devices is reduced drastically. Any component will influence the ultra-thin design. In particular, for the standardized components, it is difficult to alter their standard designs, such as the size specifications. Because the convection space is used by other components, the convecting effect is not well in thin electronic devices, leading to lowering of heat dissipating effect therein.

In a current electronic device, at least an intake is disposed at the bottom of its housing. When a heat dissipating device in the electronic device is operating, external fluid can be drawn in from the intake for dissipating the heat of the electronic components in the electronic device. Nonetheless, the intake is located at the bottom of the electronic device and facing the surface on which the electronic device is placed. The distance between the intake and the surface is very short and hence the air intake rate through the intake is small, which lowers the heat dissipating effect of the electronic device. In addition, the intake is exposed to the outer side of the housing. This will influence of appearance of the electronic device; dusts in the air also tend to enter the electronic device via the intake.

Accordingly, the present disclosure provides an adjustable air suction device disposed in an electronic device. The air suction device can increase convection space in the electronic device for improving the convecting effect of the electronic device. Hence, the heat dissipating effect of the electronic device can be enhanced. Besides, because the air suction device is hidden in the electronic device, the appearance of the electronic device is improved effectively. Dusts in the air are avoided from entering the electronic device.

SUMMARY

An objective of the present disclosure is to provide an adjustable air suction device. The air suction device is disposed in an electronic device. When the air suction device is in use, extra convention space is increased in the electronic device for improving the convecting effect of the electronic device and hence enhancing the heat dissipating effect of the electronic device.

Another objective of the present disclosure is to provide an adjustable air suction device. The air suction device has a high air intake rate capable of a great deal of fluid for dissipating the heat of the electronic components in the electronic device. Thereby, the heat dissipating effect of the electronic device is enhanced.

Still another objective of the present disclosure is to provide an adjustable air suction device. When the air suction device is not in use, the air suction device is hidden in the electronic device for improving the appearance of the electronic device as well preventing dusts in the air from entering the electronic device.

The adjustable air suction device according to the present disclosure comprises a driving structure, an air suction structure, and a link structure. The driving structure is disposed on a housing of an electronic device. The air suction structure is disposed on the housing and located on one side of the driving structure. In addition, at least a heat dissipating device is disposed on the air suction structure corresponding to the electronic device; the air suction structure has a plurality of intakes. The link structure is disposed inside the housing with one end located on the driving structure while the other on the air suction structure. The driving, structure drives one end of the link structure to move towards a first direction. Then the other end of the link structure drives the air suction, structure to move towards a second direction opposite to the first direction. The air suction structure projects from the housing. The plurality of intakes are exposed outside the housing. A fluid produced by the heat dissipating device enters the housing front the plurality of intakes of the air suction structure.

DETAILED DESCRIPTION

In order to make the structure and characteristics as well as the effectiveness of the present disclosure to be further understood and recognized, the detailed description of the present disclosure is provided as follows along with embodiments and accompanying figures.

The thin-type electronic device according to the prior art is extremely thin. Because the convection space is used by other components, the convecting effect is not well in the thin-type electronic devices, leading to lowering of heat dissipating effect therein. In the thin-type electronic device according to the prior art, at least an intake is disposed at the bottom of its housing. When a heat dissipating device in the electronic device is operating, external fluid can be drawn in from the intake for dissipating the heat of the electronic components in the electronic device. Nonetheless, the intake is located at the bottom of the electronic device and facing the surface on which the electronic device is placed. The distance between the intake and the surface is very short and hence the air intake rate through the intake is small, which lowers the heat dissipating effect of the electronic device. In addition, the intake is exposed to the outer side of the housing. This will influence of appearance of the electronic device; dusts in the air also tend to enter the electronic device via the intake.

Accordingly, the present disclosure provides an adjustable air suction device disposed in an electronic device. The air suction device can increase convection space in the electronic device for improving the convecting effect of the electronic device. Hence, the heat dissipating effect of the electronic device can be enhanced effectively. Besides, because the air suction device is hidden in the electronic device, the appearance of the electronic device is improved effectively. Dusts in the air are avoided from entering the electronic device.

Figure 1A:
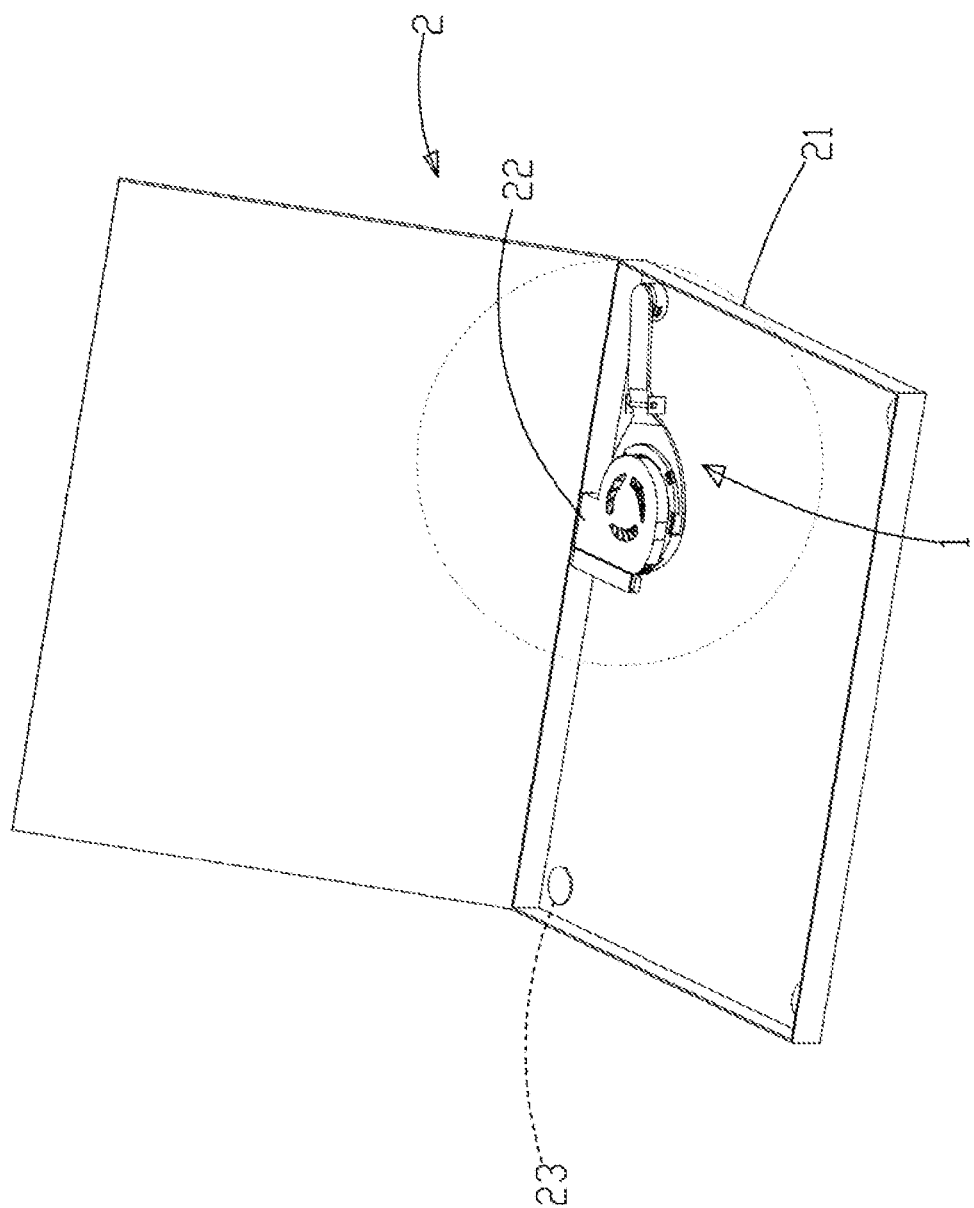
FIG. 1A shows a three-dimensional view of the air suction device according to a first embodiment of the present disclosure.
Figure 1B:
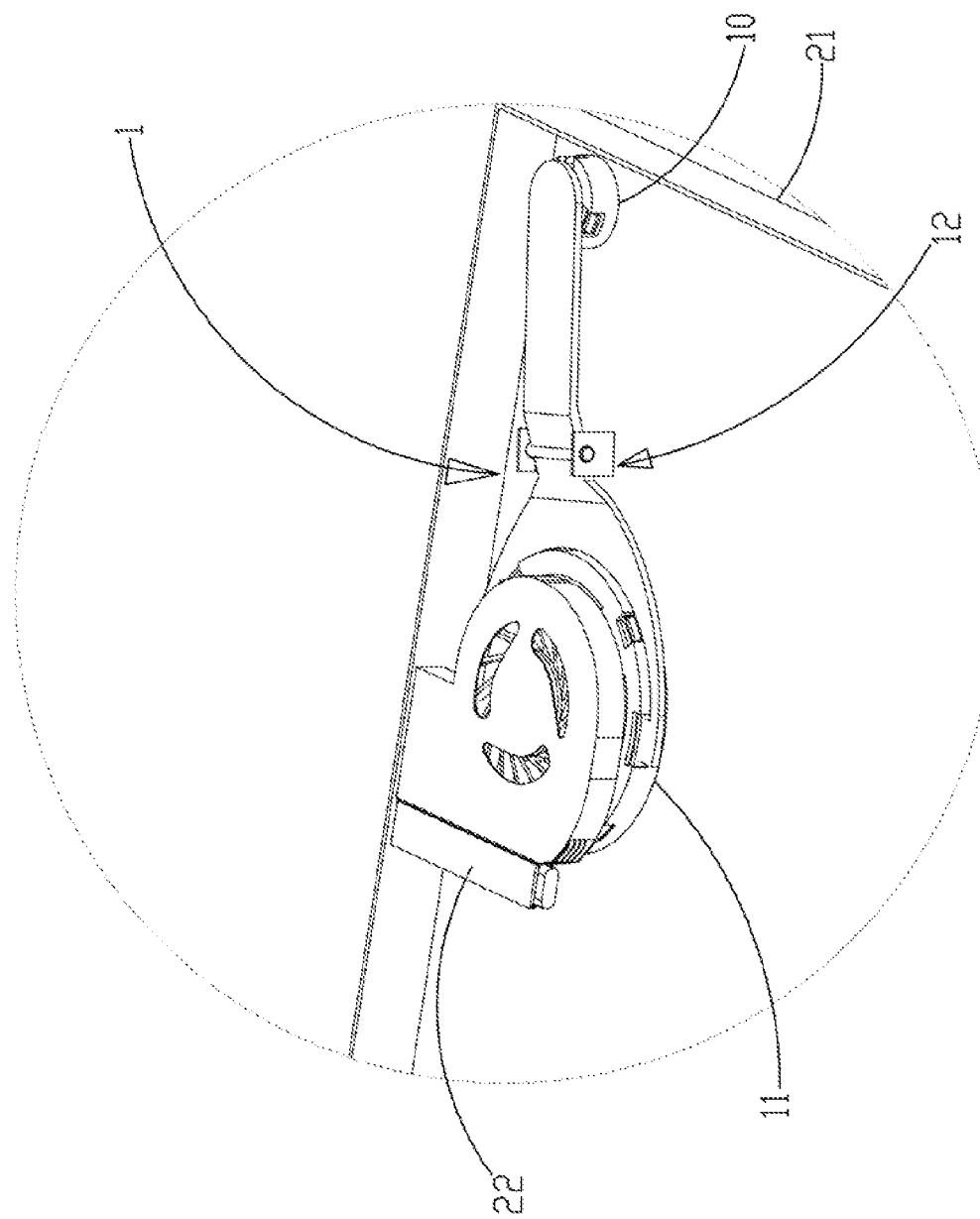
FIG. 1B shows a partially enlarged view of FIG. 1A according to the present disclosure.

FIG. 1A and FIG. 1B show a three-dimensional view and a partially enlarged view of the air suction device according to a first embodiment of the present disclosure. As shown in the figures, the present embodiment provides an adjustable air suction device 1, which is disposed in an electronic device 2, particularly a thin-type electronic device. The air suction device 1 according to the present embodiment comprises a driving structure 10, an air suction structure 11, and a link structure 12. The driving structure 10 and the air suction structure 11 are disposed on a housing 21 of the electronic device 2. The air suction structure 11 corresponds to a heat dissipating device 22, for example, a heat dissipating fan, of the electronic device 2. The driving structure 10 is located on one side of the air suction structure 11. The driving structure 10 according to the present embodiment is one of the four cushioning stands 23. In addition, the height of the driving structure 10 projecting from the housing 21 is greater than that of the other cushioning stands. The link structure 12 is disposed inside the housing 21, namely, the inside of the electronic device 2. One end of the link structure 12 is located on the driving structure 10, while the other end thereof is located on the air suction structure 11.

Figure 2A:
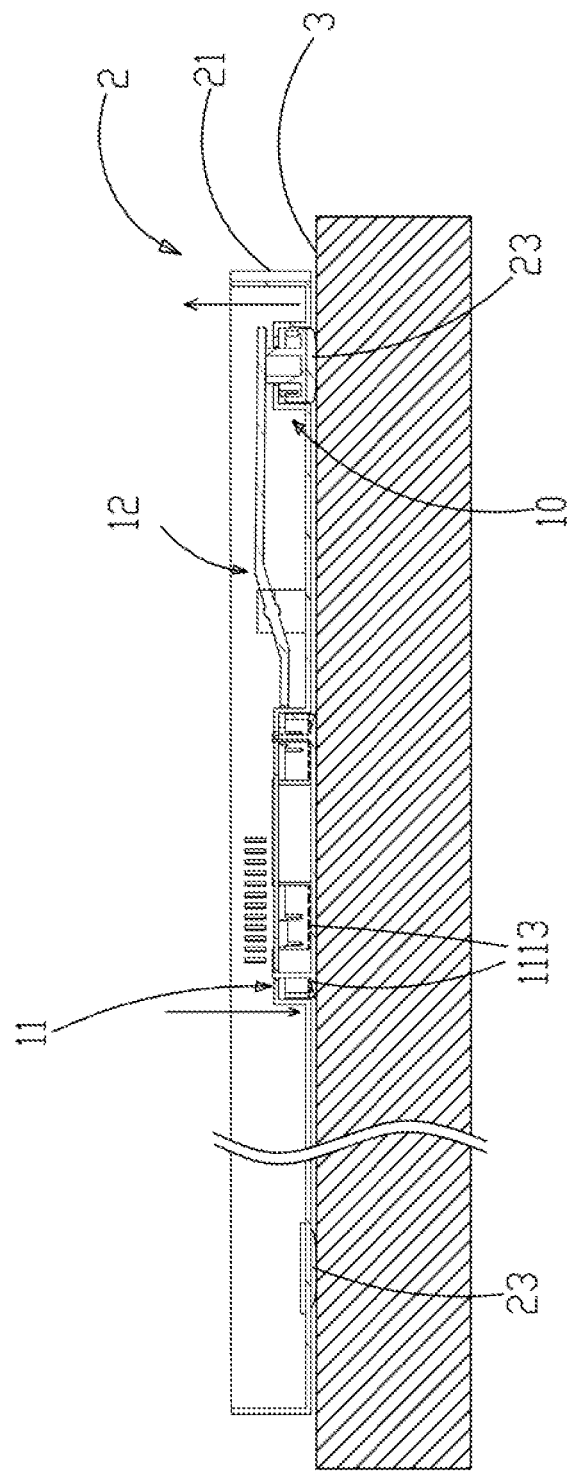
FIGS. 2A to 2C show usage views according to the first embodiment of the present disclosure.
Figure 2B:
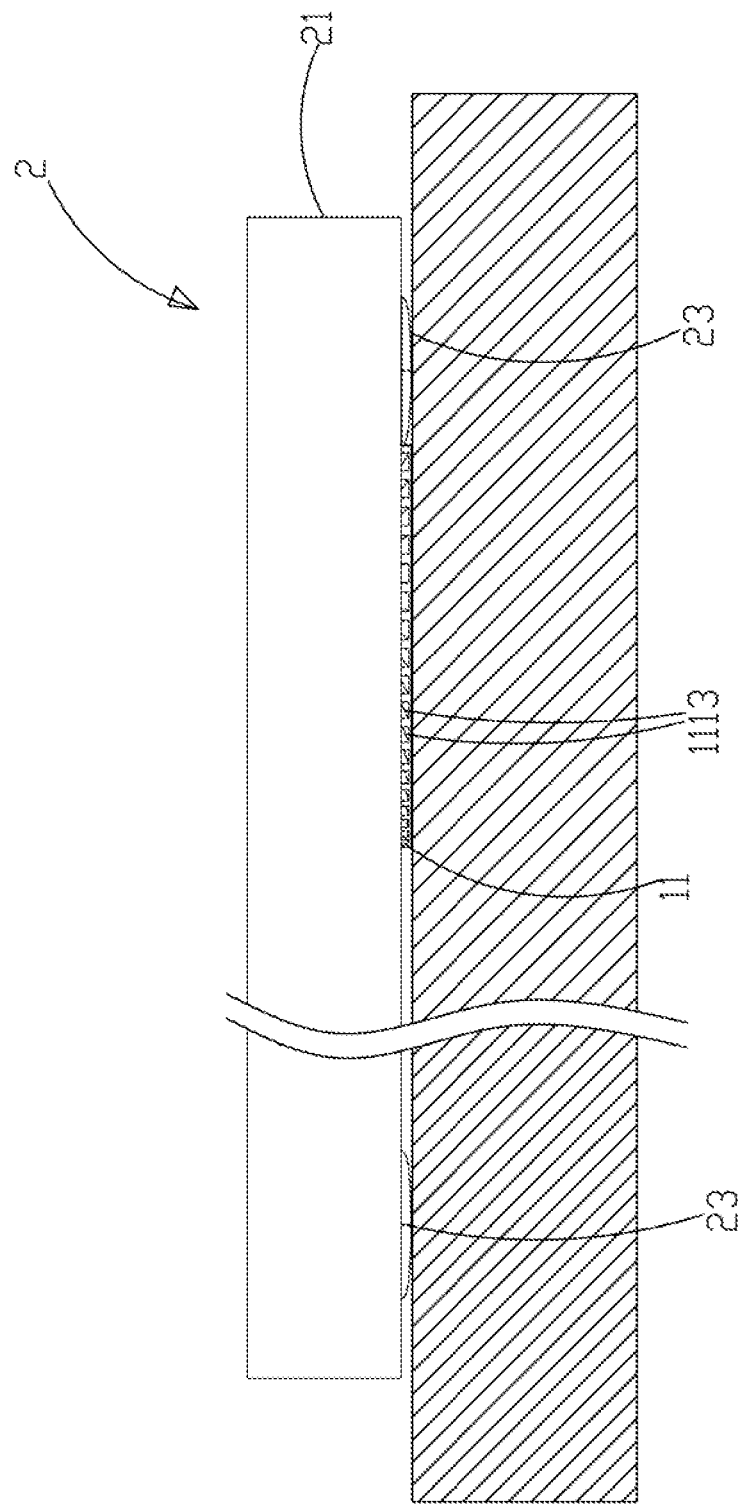
Figure 2C:
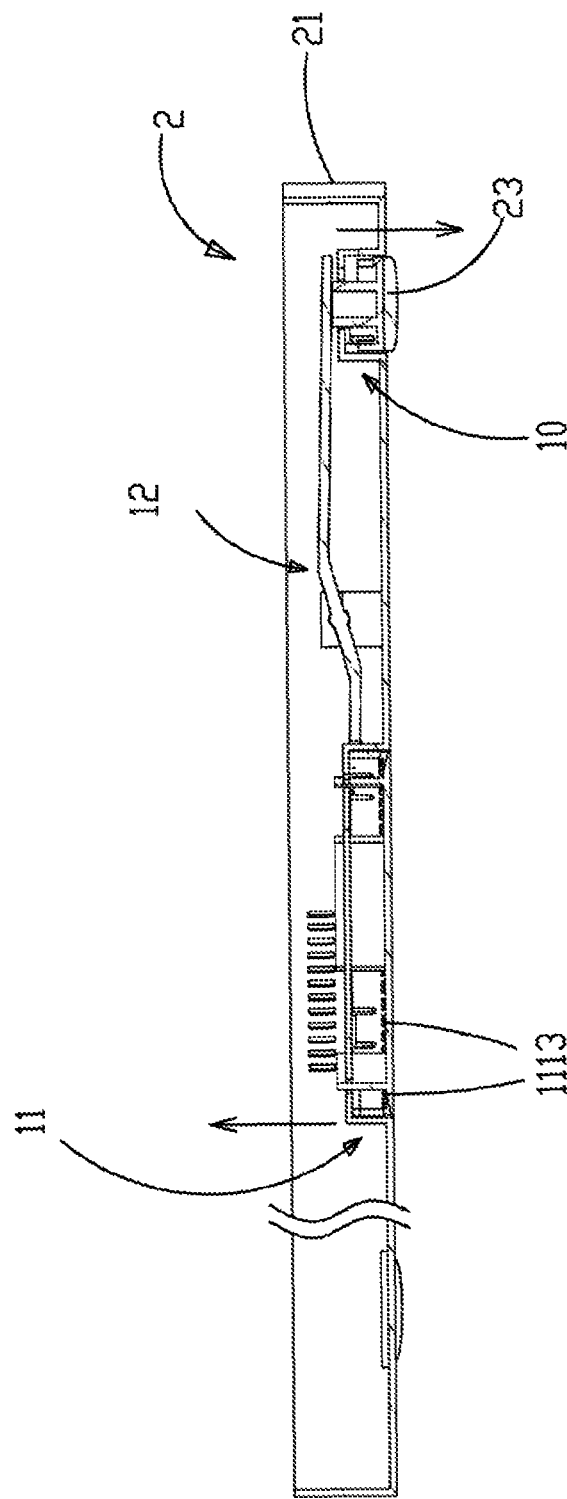
Figure 3:
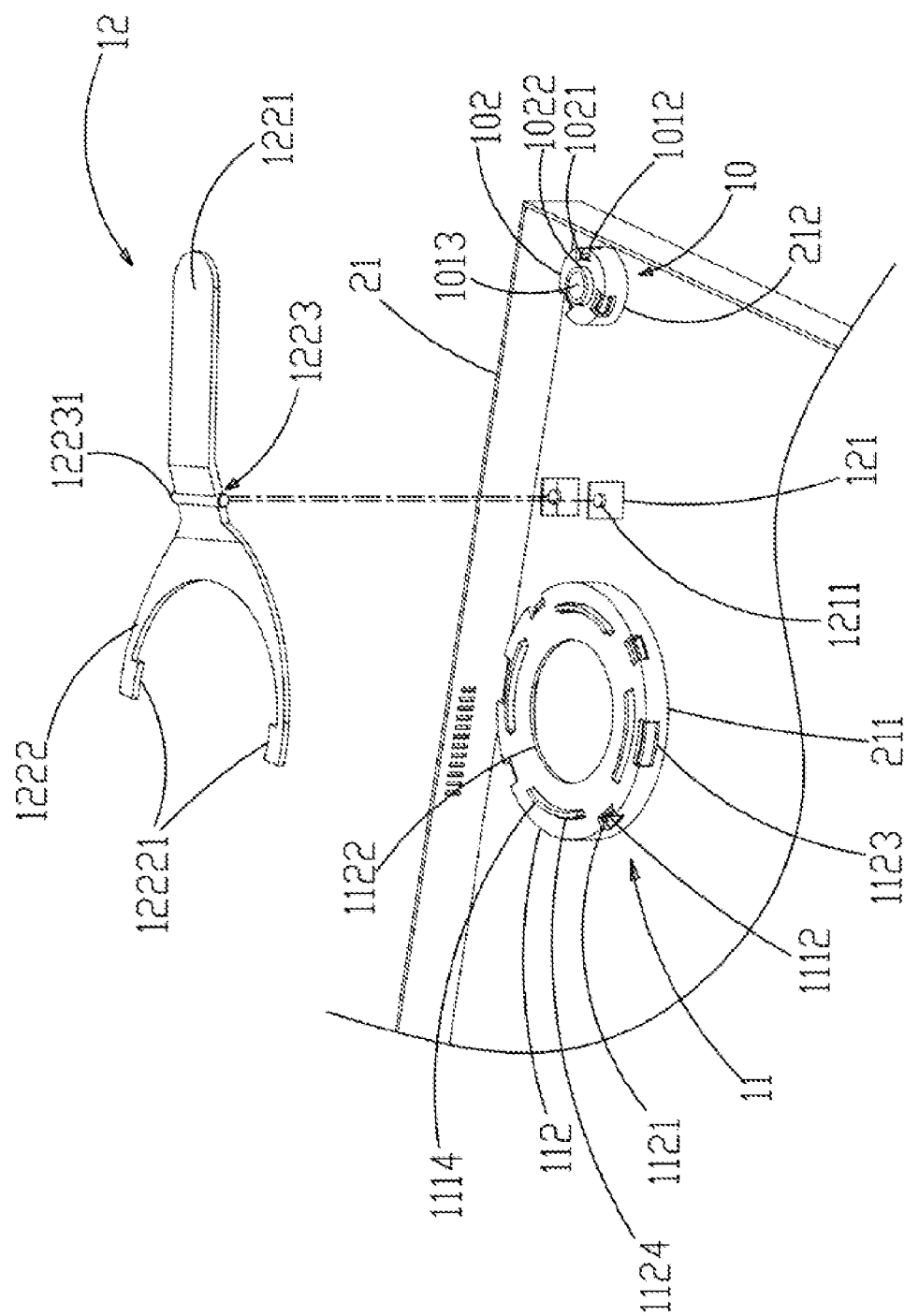
FIG. 3 shows an exploded view of the air suction device according to the first embodiment of the present disclosure.
Figure 3A:
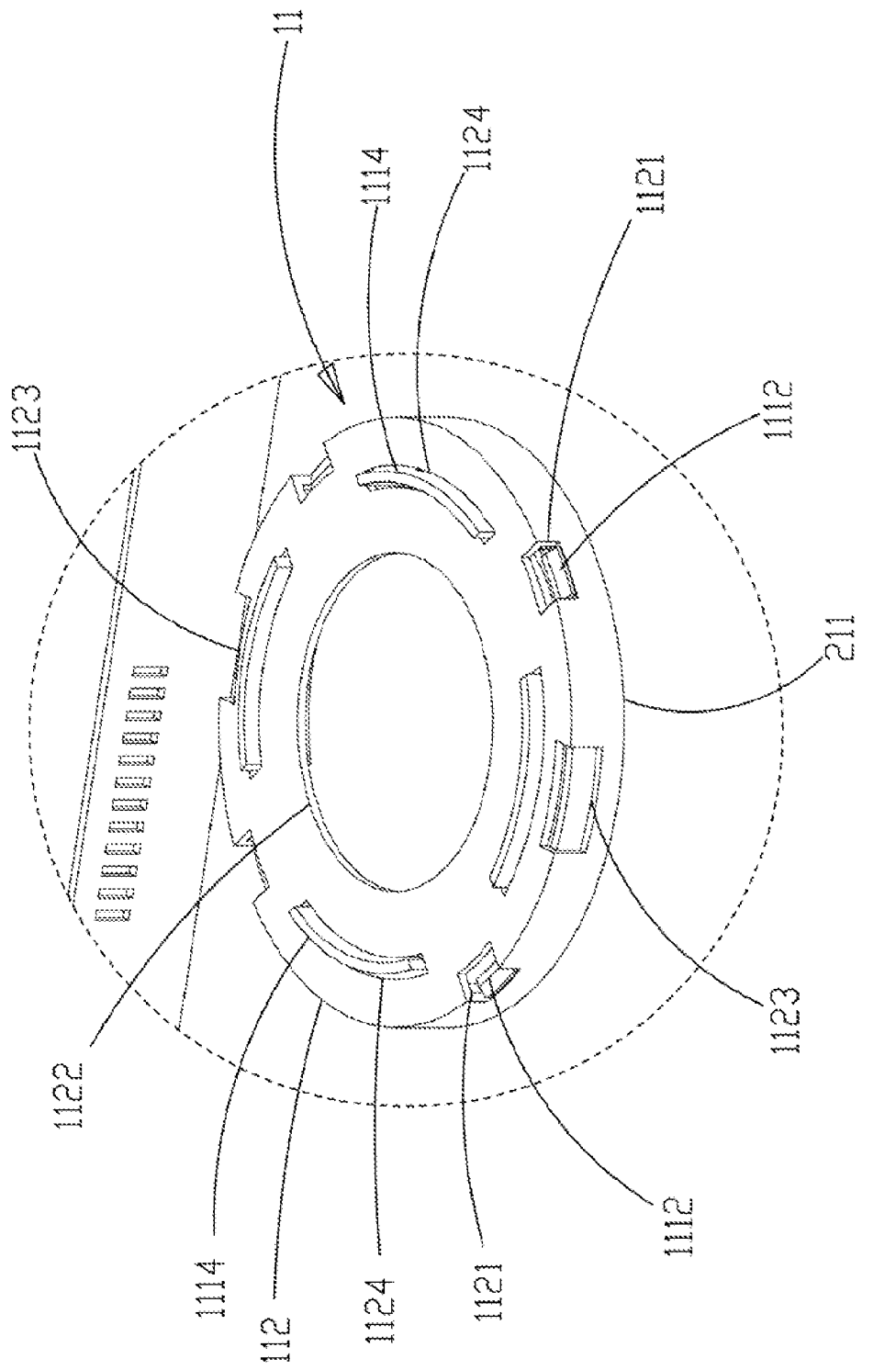
FIG. 3A shows a partially enlarged view of FIG. 3 according to the present disclosure.
Figure 3B:
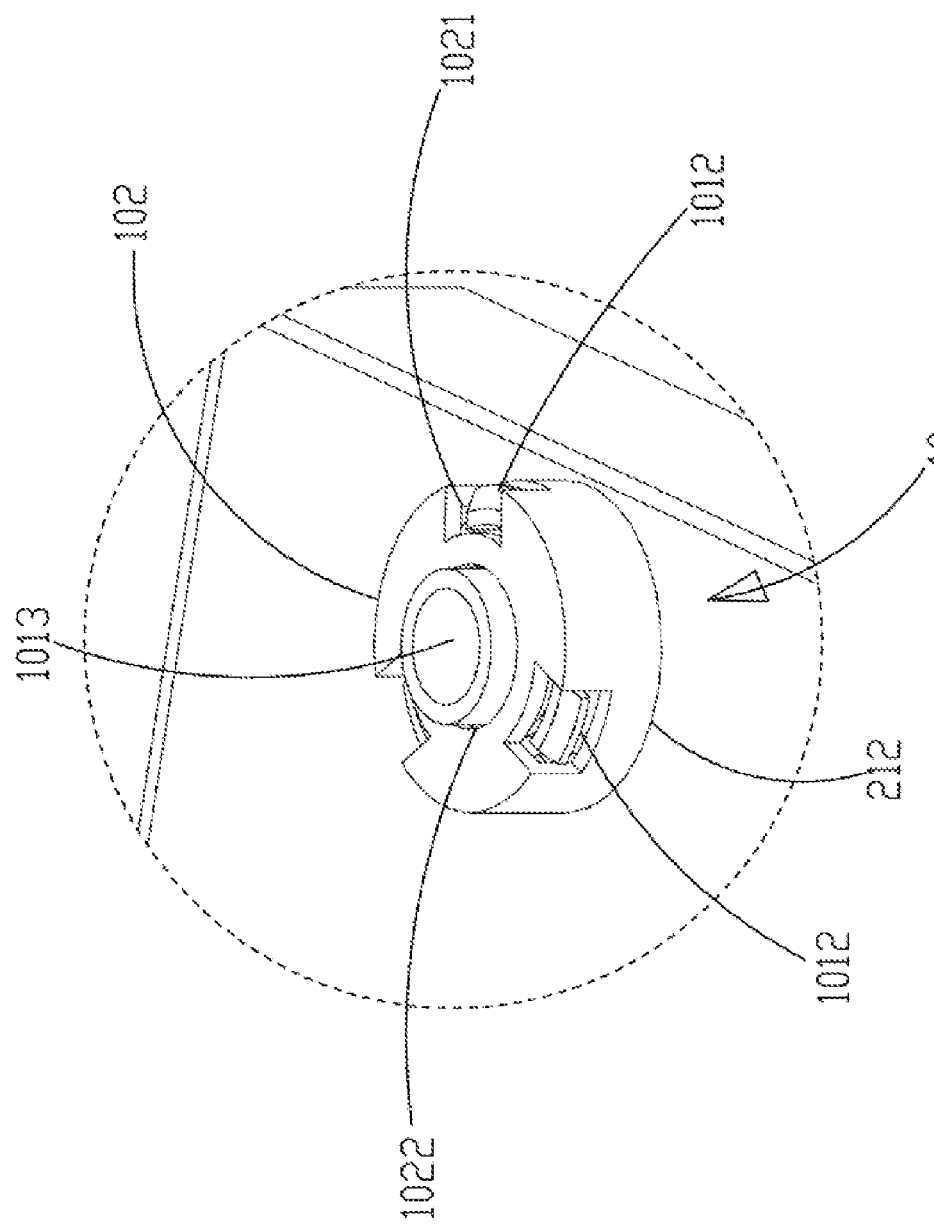
FIG. 3B shows another partially enlarged view of FIG. 3 according to the present disclosure.
Figure 4:
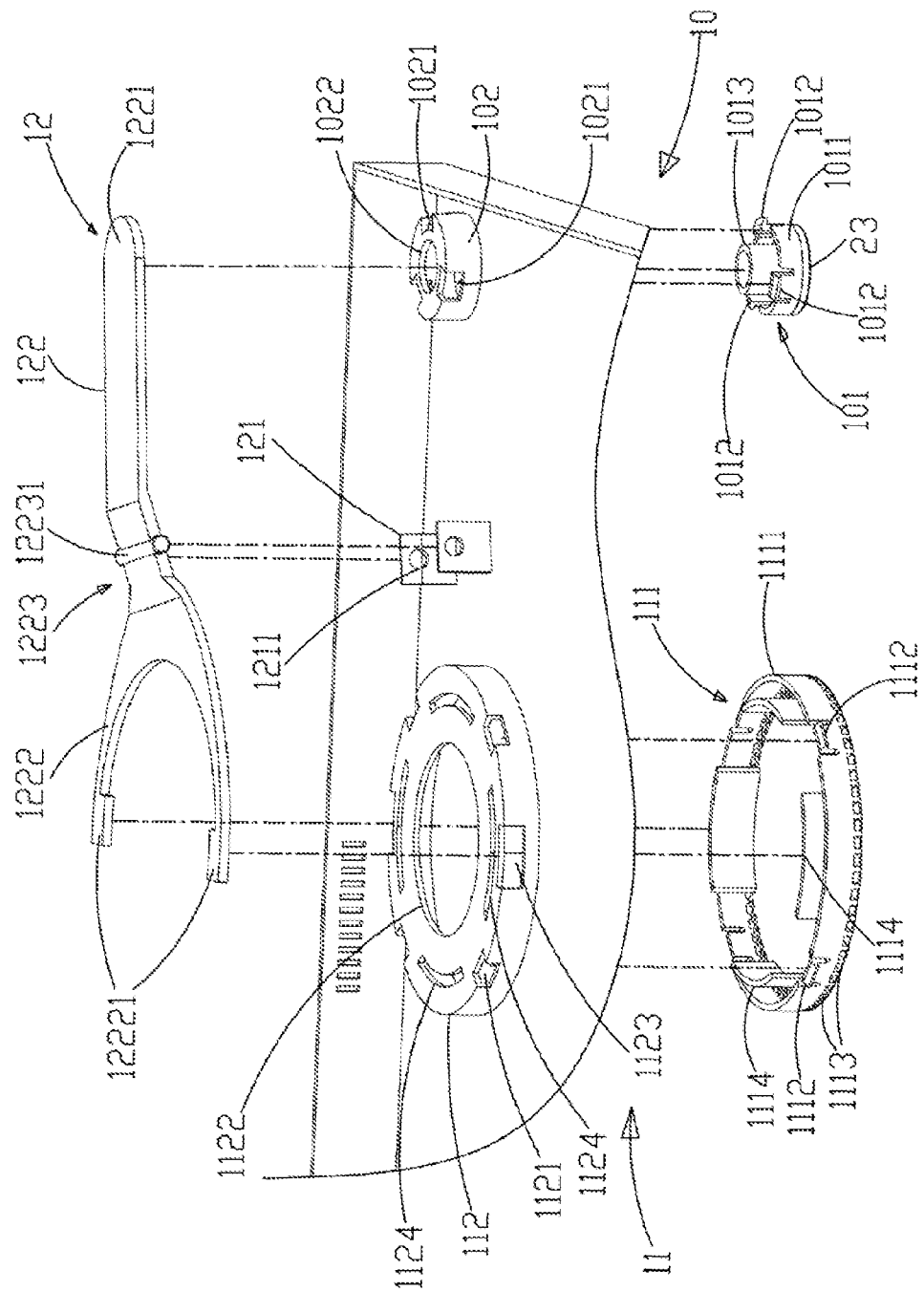
FIG. 4 shows another exploded view of the air suction device according to the first embodiment of the present disclosure.

FIGS. 2A to 2C show usage views according to the first embodiment of the present disclosure. As shown in the figures, when the electronic device 2 is placed on a plane 3, the heights of the four cushioning stands 23 of the electronic device 2 have to be identical. At this time, the driving structure 10 moves towards the inner side of the housing 21, and drives one end of the link structure 12 to move towards a first direction. When one end of the link structure 12 moves towards the first direction, the other end of the link structure 12 moves towards a second direction. The second direction described above is opposite to the first direction. The other end of the link structure 12 pushes the air suction structure 11 to move towards the outer side of the housing 21 and thus producing extra convection space for the electronic device 2. Thereby, the convecting effect of the fluids in the electronic device 2 is enhanced. Besides, the air suction structure 11 has a plurality of intakes 1113 located perpendicular to the plane 3 on which the electronic device 2 is placed. In other words, the openings of the plurality of intakes 1113 are not facing the plane 3. Thereby, the plane 3 will not be an obstacle in front, of the plurality of intakes 1113. When the heat dissipating device 22 in the electronic device 2 are operating, a great amount of fluids are drawn into the electronic device 2 from the outside. That is to say, the air suction device 1 has a high air intake rate. Then, the great amount of fluids entering from the outside of the electronic device 2 can dissipate the heat of the electronic components in the electronic device 2.

When the electronic device 2 is not placed on the plane 3, the air suction structure 11 can move towards the inner side of the housing 21, and drives the end of the link structure 12 located on the air suction structure 11 to move towards the first direction. Thereby, the end of the link structure 12 on the driving structure 10 can move towards the second direction and hence driving the driving structure 10 to return to the original position. In other words, the height of the driving structure 10 projecting from the housing 21 is greater than the height of other cushioning stands projecting from the housing 21. Accordingly, the air suction structure 11 can be hidden in the electronic device 2 completely. The beauty of the electronic device 2 is enhanced. In addition, dusts in the air are avoided from entering the electronic device 2 via the plurality of intakes 1113 of the air suction structure 11. In the following, the detailed structures of the driving structure 10, the air suction structure 11, and the link structure 12 will be described.

FIGS. 3, 3A, 3B, and 4 show exploded views and partially enlarged views of the air suction device according the first embodiment of the present disclosure. As shown in the figures, the link structure 12 includes a pivot stand 121 and a link member 122 disposed on the pivot stand 121. The pivot stand 121 is disposed inside the housing 21. The link member 122 has a first end 1221, a second end 1222, and a pivot part 1223 located between the first and second ends 1221, 1222. The pivot part 1223 of the link member 122 is connected pivotally on the pivot stand 121. The pivot part 1223 according to the present embodiment is a protruding shaft 12231. The pivot stand 121 has two fixing holes 1211 corresponding to the protruding shaft 12231. Both ends of the protruding shaft 12231 can pass through the two fixing holes 1211 of the pivot stand 121. Thereby, the first and second ends 1221, 1222 of the link member 122 can rotate about the pivot past 1223. The first end 1221 of the link member 122 is located on the driving structure 10, so that the driving structure 10 can drive the first end 1221 of the link member 122. The first end 1221 of the link member 122 can also push the driving structure in the inverse way. Likewise, the second end 1222 of the link member 122 is located on the air suction structure 11 and pushes the air suction structure 11 to move towards the second direction. The air suction structure can also push the second end 1222 of the link member 122 to move towards the first direction in the inverse way.

The driving structure 10 according to the present embodiment includes a driving member 101, which has a driving body 1011, at least a first hook part 1012, and a push part 1013. The first hook part 1012 is disposed on the periphery of an end of the driving body 1011. The push part 1013 is disposed on the driving body 1011 and located at the center of the driving body 1011. When the driving structure 10 is disposed on the housing 21 of the electronic device 2, the housing 21 has a first assembly hole 211. The driving member 101 is disposed through the first assembly hole 211. The end of the driving body 1011 not having the first hook part 1012 passes through the first assembly hole 211, namely, passing through the housing 21 and projecting from the outer side of the housing 21, and is disposed on the first hook part 1012 of the driving body 1011 and the push part 1013 located inside the housing 21. The first hook part 1012 hooks the housing 21 surrounding the first assembly hole 211. In other words, the first hook part 1012 is blocked by the housing 21 surrounding the first assembly hole 211 to avoid the driving, body 1011 escaping from the outer side of the housing 21. The push part 1013 disposed on the driving body 1011 corresponds to the first, end 1221 of the link member 122 of the link structure 12. The push part 1013 can push the first end 1221 of the link, member 122. The first end 1221 of the link member 122 can also push the push part 1013 disposed on the driving body 1011. The first end 1221 of the link member 122 can further prevent the end of the driving body 1011 having the first hook part 1012 escaping from the first assembly hole 211 towards the inner side of the housing 21. A cushioning stand 23 is disposed at the bottom of the driving member 101 according to the present embodiment. In other words, the cushioning stand 23 is disposed at the bottom of the driving body 1011 of the driving member 101.

In order to prevent the driving member 101 escaping from the first assembly hole 211 with certainty, the driving structure 10 further includes a first positioning base 102 disposed inside the housing 21 and surrounding the first assembly hole 211. The first positioning base 102 includes at least a first positioning hole 1021 disposed on and penetrating the sidewall of the first positioning base 102. The first positioning hole 1021 is provided for the first hook part 1012 of the driving member 101 for positioning the driving member 101 in the first assembly hole 211. When the driving member 101 moves in the first assembly hole 211, the first hook part 1012 can move in the first positioning hole 1021. The first positioning hole 1021 can limit, the moving range of the first hook part 1012 for prevent the driving member 101 escaping from the first assembly hole 211.

Moreover, a first guiding hole 1022 is further disposed at the bottom of the first positioning base 102 according to the present embodiment. The first guiding hole 1022 is provided to be passed through by the push part 1013 disposed on the driving body 1011. When the driving member 101 is moving in the first assembly hole 211, the push part 1013 of the driving member 101 moves in the first guiding hole 1022. The first guiding hole 1022 can maintain linear motion of the driving member 101 and thus ensuring that the push part 1013 of the driving member 101 can push the first end 1221 of the link member 122.

Refer again to FIG. 4. The air suction structure 11 according to the present embodiment includes art air suction member 111, which comprises an air suction body 1111, at least a second hook pan 1112, and a plurality of intakes 1113. The second hook part 1112 is disposed on the periphery of the air suction body 1111. The plurality of intakes 1113 are located on and penetrates the sidewall of the air suction body 1111. The air suction structure 11 is disposed on the housing 21, which has a second assembly hole 212. The air suction body 1111 of the air suction member 111 passes through the second assembly hole 212. The second hook part 1112 is located inside the housing 21. The housing 21 surrounding the second assembly hole 212 blocks the second hook part 1112 for preventing the air suction member 111 escaping from the second assembly hole 212. The second end 1222 of the link member 122 of the link structure 12 is located on the air suction member 111. The second end 1222 of the link member 122 has at least a leaning part 12221 leaning against the periphery of the air suction body 1111 of the air suction member 111 for controlling the movement of air suction member 111 in the second assembly hole 212.

The air suction structure 11 further includes a second positioning base 112 disposed inside the housing 21 and surrounding the second assembly hole 212. The second positioning base 112 includes at least a second positioning hole 1121 disposed on and penetrating the sidewall of the second positioning base 112. The second hook part 1112 of the air suction member 111 is disposed in the second positioning hole 1121 of the second positioning base 112. When the air suction member 111 moves in the second assembly hole 212, the second hook part 1112 of the air suction member 111 moves in the second positioning hole 1121, which limits the moving range of the second hook part 1112 for preventing the air suction member ill escaping from the second assembly hole 212. In addition, at least a vent 1122 is further disposed at the bottom of the second positioning base 112 and communicating with the plurality of intakes 1113, so that the external fluids can enter from the intakes 1113 and pass through the vents 1122 to the inside of the electronic device 2. At least a third positioning hole 1123 is further disposed on the sidewall of the second positioning base 112. The leaning part 12221 of the link member 122 is disposed in the third positioning hole 1123, which can limit the position of the leaning part 12221 to make the leaning part 12221 lean firmly against the periphery of the air suction body 1111 of the air suction member 111.

At least a second guiding, hole 1124 is disposed at the bottom of the second positioning base 112. The air suction body 1111 has at least a guiding part 1114 disposed in the second guiding hole 1124. When the air suction member 111 moves in the second assembly hole 212, the guiding part 1114 on the air suction body 1111 moves in the second guiding hole 1124 and thus making the air suction member 111 move linearly in the second assembly hole 212. Thereby, it is guaranteed that the air suction member 111 can move towards the outer side of the housing 21 smoothly when pushed by the second end 1222 of the link member 122, and that the air suction member 111 can be accommodated inside the housing 21.

When the air suction member 111 is pushes by the second end 1222 of the link member 122, the end of the air suction member 111 having the plurality of intakes 1113 moves towards the outer side of the housing 21 to expose the plurality of intakes 1113 on the outer side of the housing 21. The direction of the openings of the plurality of intakes 1113 is perpendicular to the plane 3 on which the electronic device 2 is placed so that the intakes 1113 are not obstructed by the plane 3. Thereby, the intakes 1113 cart draw in as great amount of fluids, which can dissipate heat of the electronic components in the electronic device 2 and improve the heat dissipating effect of the electronic device 2 substantially. When the electronic device 2 is placed on the plane 3, the air suction member 111 can move to the inner side of the housing 21 and push the second end 1222 of the link member 122 to move towards the first direction, which moves the first end 1221 of the link member 122 towards the second direction. The first end 1221 of the link member 122 can push the driving member 101 to the outer side of the housing 21.

Figure 5:
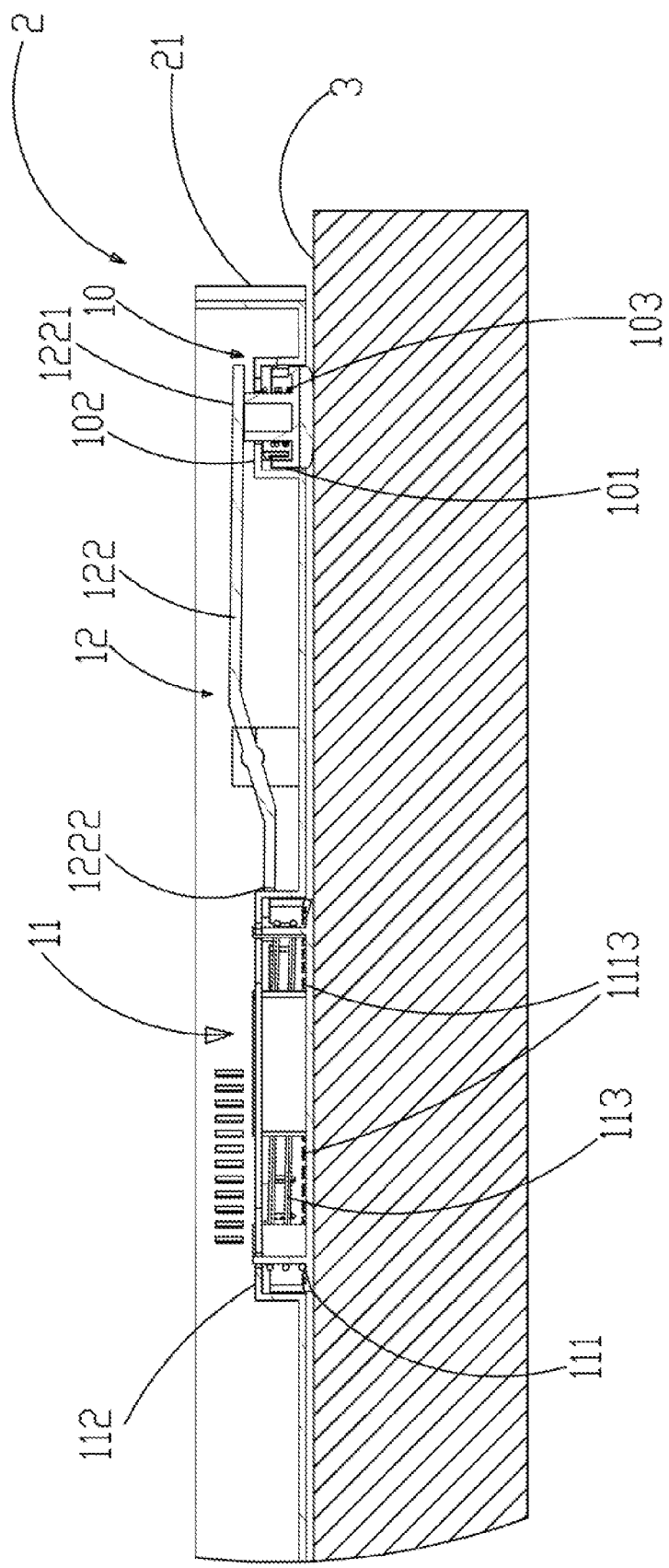
FIG. 5 shows a cross-sectional view of the air suction device according to a second embodiment of the present disclosure.

FIG. 5 shows a cross-sectional view of the air suction device according to a second embodiment of the present disclosure. As shown in the figure, the difference between the present embodiment and the previous one is that according to present embodiment, a first elastic member 103 is disposed between the driving member 101 of the driving structure 10 and the first positioning base 102. While a second elastic member 113 is disposed between the air suction member 111 of the air suction structure 11 and the second positioning base 112.

When the electronic device 2 is placed on the plane 3, the driving member 101 moves to the inner side of the housing 21. The first elastic member 103 in the driving structure 10 is compressed by the driving member 101. The push pan 1013 of the driving member 101 drives the first end 1221 of the link member 122 to move towards the first direction. The second end 1222 of the link member 122 moves towards the second direction, and drives the air suction member 111 of the air section structure 11 to move to the outer side of the housing 21, and hence exposing the plurality of intakes 1113 of the air suction member 111 to the outer side of the housing 21.

When the electronic device 2 is not disposed on the plane 3, the compressed first elastic member 103 in the driving structure 10 is released. The first elastic member 10 pushes the driving member 101 to move to the outer side of the housing 21. The push part 1013 of the driving member 101 drives the first end 1221 of the link member 122 to move towards the second direction. The second end 1222 of the link member 122 moves towards the first direction, and drives the air suction member 111 to move towards the inner side of the housing 21, and thus hiding the air suction member 111 in the housing 21 of the electronic device 2. The air suction device 1 according to the present embodiment can use the first and second elastic members 103, 113 operating in coordination to enable automatic operation of the air suction device 1. Thereby, no manual operation is required.

To sum up, the present disclosure relates to an adjustable air suction device used in an electronic device. The air suction device can increase convection space in the electronic device for improving the convecting effect thereof in addition, because the intakes of the air suction device according to the present disclosure is not directed to the plane on which the electronic device is placed, they are not obstructed by the plane; the intakes can draw in a great amount of fluids. Hence, the heat dissipating effect of the electronic device can be enhanced effectively. When the air suction device is not in use, it can be hidden in the electronic device. Thereby, external dusts are avoided from entering the electronic device, and thus improving the appearance of the electronic device effectively.

Accordingly, the present disclosure conforms to the legal requirements owing to its novelty, nonobviousness, and utility. However, the foregoing description is only embodiments of the present disclosure, not used to limit the scope and range of the present disclosure. Those equivalent changes or modifications made according to the shape, structure, feature, or spirit described in the claims of the present disclosure are included in the appended claims of the present disclosure.

The invention claimed is:

1. An adjustable air suction device, comprising:
   a driving structure, disposed on a housing of an electronic device;
   an air suction structure, disposed on said housing, located on one side of said driving structure, corresponding to at least a heat dissipating device of said electronic device, and having a plurality of intakes; and
   a link structure, disposed inside said housing, and having one end located on said driving structure and the other end located on said air suction structure;
   where said driving structure drives one end of said link structure to move towards a first direction; the other end of said link structure drives said air suction structure to move towards a second direction opposite to said first direction; said air suction structure projects from the outer side of said housing; said plurality of intakes are exposed on the outer side of said housing; and a fluid produced by said heat dissipating device entering said housing from said plurality of intakes of said air suction structure.

2. The air suction device of claim 1, wherein said link structure comprises:
   a pivot stand, disposed inside said housing; and
   a link member, having a first end, a second end, and a pivot part located between said first end and said second end, said pivot part connected pivotally to said pivot stand, said first end located on said driving structure, and said second end located on said air suction structure.

3. The air suction device of claim 2, wherein said pivot stand has two fixing holes: said pivot part is a protruding shaft; and both ends of said protruding, shaft pass through said two fixing holes, respectively.

4. The air suction device of claim 2, wherein said driving structure includes a driving member, comprising:
   a driving body, passing through a first assembly hole of said housing;
   at least a first hook part, disposed on the periphery of said driving body, located inside said housing, and hooking, said first assembly hole; and
   a push part, disposed on said driving body, located inside said housing, and corresponding to said first end of said link member.

5. The air suction device of claim 4, and further comprising a cushioning stand disposed on the bottom of said driving body.

6. The air suction device of claim 4, wherein said air suction structure includes an air suction member, comprising:
   an air suction body, disposed in a second assembly hole of said housing, corresponding to said heat dissipating device of said electronic device, and said plurality of intakes disposed on the sidewall of said air suction body; and
   at least a second hook part, disposed on the periphery of said air suction body, and hooking said housing surrounding said second assembly hole.

7. The air suction device of claim 4, wherein said driving structure further comprises a first positioning base, disposed inside said housing and surrounding said first assembly hole, having at least a first positioning hole on the sidewall of said first positioning base, and said first hook part disposed in said first positioning hole.

8. The air suction device of claim 7, and further comprising a cushioning stand disposed on the bottom of said driving body.

9. The air suction device of claim 7, wherein said air suction structure includes an air suction member, comprising:
   an air suction body, disposed in a second assembly hole of said housing, corresponding to said heat dissipating device of said electronic device, and said plurality of intakes disposed on the sidewall of said air suction body; and
   at least a second hook part, disposed on the periphery of said air suction body, and hooking said housing surrounding said second assembly hole.

10. The air suction device of claim 7, wherein a first guiding hole is further disposed at the bottom of said first positioning base, and said push part passes through said first guiding hole.

11. The air suction device of claim 10, and further comprising a cushioning stand disposed on the bottom of said driving body.

12. The air suction device of claim 10, wherein said air suction structure includes an air suction member, comprising:
   an air suction body, disposed in a second assembly hole of said housing, corresponding to said heat dissipating device of said electronic device, and said plurality of intakes disposed on the sidewall of said air suction body; and
   at least a second book part, disposed on the periphery of said air suction body, and hooking said housing surrounding said second assembly hole.

13. The air suction device of claim 12, wherein said air suction structure further includes a second positioning base, disposed inside said housing and surrounding said second assembly hole, having at least a second positioning hole and at least a third positioning hole on the sidewall of said second positioning base, said second hook part disposed in said second positioning hole, at least a vent disposed on the bottom of said second positioning base, and said vent communicating with said plurality of intakes.

14. The air suction device of claim 7, wherein said driving structure further includes a first elastic member disposed between said driving member and said first positioning base.

15. The air suction device of claim 14, and further comprising a cushioning stand disposed on the bottom of said driving body.

16. The air suction device of claim 2, wherein said air suction structure includes an air suction member, comprising:
- an air suction body, disposed in a second assembly hole of said housing, corresponding to said heat dissipating device of said electronic device, and said plurality of intakes disposed on the sidewall of said air suction body; and
- at least a second hook part, disposed on the periphery of said air suction body, and hooking said housing surrounding said second assembly hole.

17. The air suction device of claim 16, wherein said air suction structure further includes a second positioning base, disposed inside said housing and surrounding said second assembly hole, having at least a second positioning hole and at least a third positioning hole on the sidewall of said second positioning base, said second hook part disposed in said second positioning hole, at least a vent disposed on the bottom of said second positioning base, and said vent communicating with said plurality of intakes.

18. The air suction device of claim 17, wherein at least a third positioning hole is disposed on the sidewall of said second positioning base, and said third positioning hole is used for disposing at least a leaning part of said link member.

19. The air suction device of claim 17, wherein at least a second guiding hole is further disposed on the bottom of said second positioning base, and said air suction body has at least a guiding part disposed in said second guiding hole.

20. The air suction device of claim 17, wherein said air suction structure further includes a second elastic member disposed between said air suction member and said second positioning base.

21. The air suction device of claim 17, wherein said plurality of intakes of said air suction structure are perpendicular to a plane on which said electronic device is placed.

* * * * *